(12) United States Patent
Cheng et al.

(10) Patent No.: US 7,084,449 B2
(45) Date of Patent: Aug. 1, 2006

(54) MICROELECTRONIC ELEMENT HAVING TRENCH CAPACITORS WITH DIFFERENT CAPACITANCE VALUES

(75) Inventors: Kangguo Cheng, Beacon, NY (US); Johnathan E. Faltermeier, LaGrangeville, NY (US); David R. Hanson, Brewster, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,146

(22) Filed: Jun. 22, 2004

(65) Prior Publication Data

US 2005/0280063 A1    Dec. 22, 2005

(51) Int. Cl.
*H01L 27/108* (2006.01)
*H01L 29/00* (2006.01)
(52) U.S. Cl. ..................... 257/301; 257/532
(58) Field of Classification Search ............. 257/301, 257/303, 304, 306, 311, 532, 534; 438/243, 438/244, 253, 386, 387, 396
See application file for complete search history.

(56) References Cited

U.S. PATENT DOCUMENTS 5,731,949 A * 3/1998 Ko ........................ 361/313
6,566,191 B1   5/2003 Hsu et al.

* cited by examiner

*Primary Examiner*—Hung Vu
(74) *Attorney, Agent, or Firm*—Daryl K. Neff; H. Daniel Schnurmann

(57) ABSTRACT

A microelectronic element is provided having a major surface, the microelectronic element including a first capacitor formed on a sidewall of a first trench, the first trench being elongated in a downwardly extending direction from the major surface. The microelectronic element further includes a second capacitor formed on a sidewall of a second trench, the second trench being elongated in a downwardly extending direction from the major surface, wherein a top of the first capacitor is disposed at a first depth from the major surface, and a top of the second capacitor is disposed at a second depth from the major surface.

13 Claims, 6 Drawing Sheets

MICROELECTRONIC ELEMENT HAVING TRENCH CAPACITORS WITH DIFFERENT CAPACITANCE VALUES

BACKGROUND OF INVENTION

The present invention relates to microelectronic devices and processing, and more particularly to a microelectronic element and method for forming trench capacitors having different capacitance values on the same microelectronic element.

As the speed and circuit density of integrated circuits ("ICs" or "chips") is increased from one generation to the next, a greater need exists for capacitive elements that are located close to logic circuits of a chip, or as parts of internal power supply circuits, for example. Thus, capacitive elements must often be provided on the same integrated circuit as such logic circuits and power supply circuits. Trench capacitors are used for storing data bits in some types of dynamic random access memories (DRAMs) and embedded DRAM (eDRAM) macros of chips that contain other functional elements such as processors. In such chips, the use of trench capacitors is favored for other purposes, e.g., to support logic circuits, and as parts of internal power supply circuits, because such other purpose trench capacitors can be formed at the same time as the trench capacitors of the DRAM or eDRAM. When a fairly large amount of capacitance is needed on a chip for such other purpose, a large number of trench capacitors are usually wired together, all having first plates held at a fixed potential such as ground and second plates wired together on which the potential is allowed to vary during operation or remains at a constant potential during operation. In such circumstances, significant usable area of an integrated circuit is occupied by an array of trench capacitors that are wired together of such purpose. Accordingly, the size of such array of trench capacitors is desirably made small, in order not to take up too much of the area of the integrated circuit.

One way of decreasing the size of such capacitor arrays is to enlarge the lateral, i.e. horizontal, dimensions of individual trench capacitors of the array, such as described in U.S. Pat. No. 6,566,191. For example, if the lateral dimension of the trench capacitor of a DRAM array is 90 nm in one lateral direction, the lateral dimension of a trench capacitor used for the different purpose, e.g., to support logic circuits, could be 135 nm, for example. However, the etching of trenches to different lateral dimensions is difficult. Reactive ion etching (RIE) of a hard mask layer and RIE of the underlying semiconductor substrate are difficult to adequately control when trenches having such different dimensions. In particular, the silicon profile control is difficult to maintain during an etching process for simultaneously etching trenches having two different lateral dimensions.

It would be desirable to provide a process of forming trench capacitors in which the lateral dimensions of the trench capacitors are substantially the same, such that the foregoing difficulties in etching are avoided.

In addition to their use for particular purposes on DRAM and logic chips, and combined DRAM and logic chips, capacitive elements are sometimes provided as integrated elements of a passive microelectronic element that contains only passive devices (e.g., capacitors, resistors and/or inductors). Such passive microelectronic element is sometimes referred to as an integrated passives on chip ("IPOC") element. An IPOC is typically fabricated from a semiconductor, ceramic or glass substrate, having a coefficient of thermal expansion (CTE) that usually matches that of another integrated circuit. The IPOC typically contains a set of contacts on a surface to be bonded to some or all of corresponding contacts of an active chip that has active circuits, e.g., containing elements that have a switching, amplification or rectification function such as transistors and diodes. In such way, the IPOC can be mounted at very close spacing to the other integrated circuit, as through a ball grid array or land grid array, for example. Even in such IPOC, space may need to be conserved, and fabrication techniques may need to be simplified and well-controlled, as it is on an active chip. Accordingly, trench capacitors may be used in such IPOC, in which case, similar considerations apply to their use and fabrication.

SUMMARY OF INVENTION

A microelectronic element is provided having a major surface, the microelectronic element including a first capacitor formed on a sidewall of a first trench, the first trench being elongated in a downwardly extending direction from the major surface. The microelectronic element further includes a second capacitor formed on a sidewall of a second trench, the second trench being elongated in a downwardly extending direction from the major surface, wherein a top of the first capacitor is disposed at a first depth from the major surface, and a top of the second capacitor is disposed at a second depth from the major surface.

DETAILED DESCRIPTION

Figure 1:
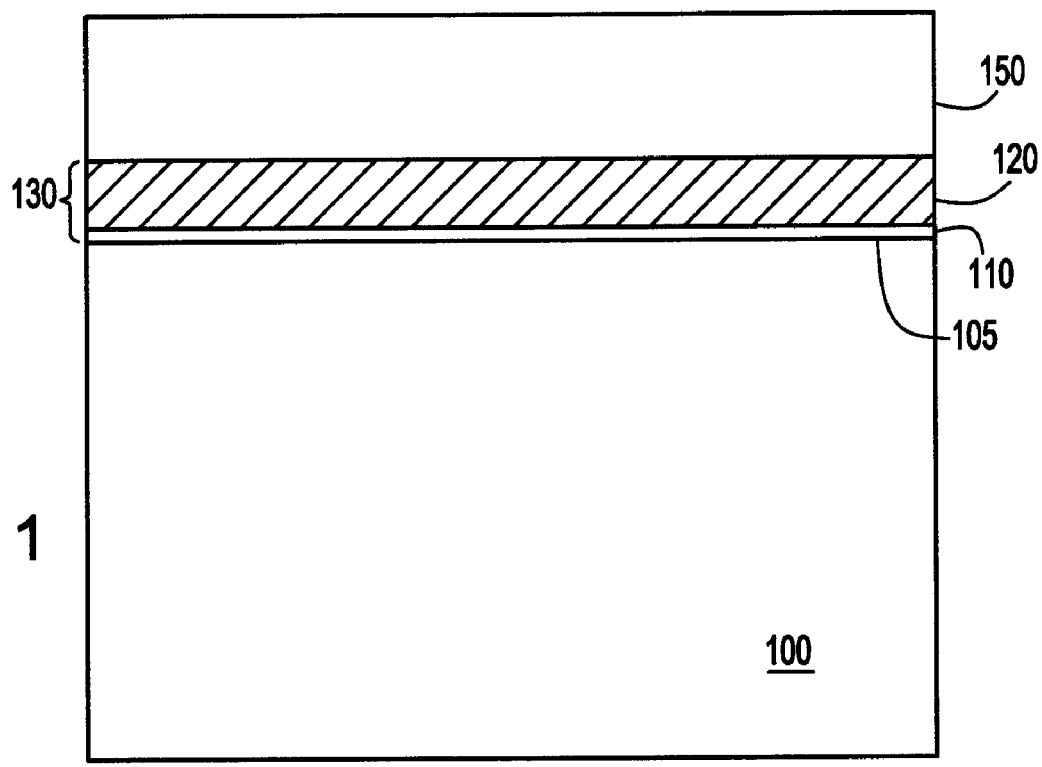
FIGS. 1 through 8 illustrate stages in a process of forming trench capacitors having different capacitance values according to an embodiment of the invention.
Figure 2:
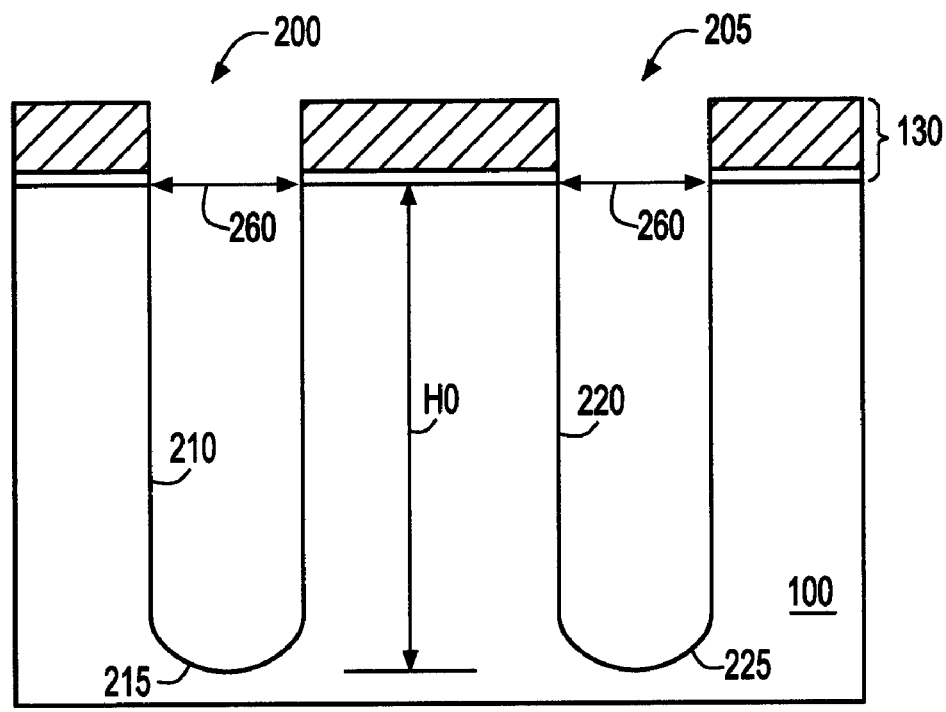

FIGS. 1 through 8 illustrate stages in the fabrication of trench capacitors according to an embodiment of the invention. FIGS. 1 and 2 illustrate a process of patterning deep trenches 200, 205. Illustratively, in this process, the deep trenches are patterned in a semiconductor substrate 100, which typically consists essentially of p-type doped silicon. Alternatively, the substrate has a semiconductor-on-insulator type structure, e.g., is a silicon-on-insulator (SOI) substrate. Other suitable alternative types of substrates include germanium, silicon germanium, strained silicon, and those consisting essentially of one or more compound semiconductors having a composition defined by the formula $Al_{X1}Ga_{X2}In_{X3}As_{Y1}P_{Y2}N_{Y3}Sb_{Y4}$ where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates have a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). In still another embodiment, which will be described later, the substrate consists essentially of any suitable patternable dielectric such as ceramic, glass, etc.

In a first embodiment, trench capacitors are formed in a semiconductor substrate, preferably a substrate consisting essentially of single-crystal silicon, or alternatively, a silicon-on-insulator substrate. In this embodiment, the fabrication of trench capacitors generally follows the processing of trench capacitors used as storage capacitors of a DRAM array, except for steps which cause the trench capacitors to be disposed recessed to different depths from the surface of the substrate. In this way, at least some of the trench capacitors formed by the herein-described method are usable as storage capacitors of a DRAM array, while other trench capacitors are available for other uses.

A variety of methods may be utilized to form deep trenches. Typically, a mask layer is first formed and patterned on the substrate, the mask layer including a material that is less susceptible to etching, such a hard mask layer of silicon oxide and/or silicon nitride or other material. FIG. 1 shows one embodiment in which an oxide layer 150 functions as a hardmask layer, disposed overlying a pad stack 130 having a nitride layer 120 and an optional oxide layer 110. The oxide layer 110 is formed between the pad nitride layer 120 and the major surface 105 of the semiconductor substrate 100 as a buffer layer to improve the adhesion of the pad nitride layer 120 and to reduce the interface stress.

FIG. 2 illustrates a subsequent stage of processing, after the hardmask layer (FIG. 1) is patterned, and the underlying pad stack 130 and the substrate 100 have been etched to form a first and a second vertically elongated trenches 200, 205 that extend downwardly from the major surface 105 to a bottom depth H0. Preferably, the bottom depth H0 of the trenches 200, 205 is substantially uniform, except for process-related variations that may occur across a chip or wafer into which the trenches are etched. In semiconductor processing, such vertically elongated trenches are commonly referred to as "deep trenches." Typically, a very large number of such deep trenches, e.g., millions or more such trenches, are etched simultaneously by this process. Therefore, reference to first and second trenches 200, 205 is illustrative of many trenches to which the same processing is applied.

The remaining hardmask layer is stripped after etching the deep trenches. The deep trenches are etched to very small lateral dimensions, e.g., critical dimensions, which are selected according to the current generation of semiconductor devices. Preferably, all of the deep trenches on a substrate are uniformly patterned to the same lateral dimensions. Such lateral dimensions include the width 260 of the trenches in a first direction parallel to the major surface 105, and the width of the trench in a second direction into and out of the sheet (not visible in FIG. 2), that direction also being parallel to the major surface 105. Trenches of DRAM chips are typically patterned to have an oval or oblong shape, as viewed from the major surface 105 of the substrate 100. For example, in one embodiment, the trenches are patterned to have a small width 260 in a first lateral direction that is selected to be a value such as 90 nm, while a large width in a second lateral direction of the trench is selected to be a larger value such as 180 nm. Photolithographic imaging of very small or critical dimensioned photoresist patterns and the subsequent etching of trenches into a substrate are more easily and accurately controlled when all deep trenches of a substrate 100 are patterned to have the same lateral dimensions.

The deep trench is typically etched to a depth ranging between about 2 microns (µm) and 10 µm. Etching defines a first trench 200 having a sidewall 210, and a bottom 215, and a second trench 205 having a sidewall 220 and a bottom 225. Hereinafter, references to the trench sidewall generally and to the lower portion of the trench sidewall shall be understood to include the trench bottom as well.

Figure 3:
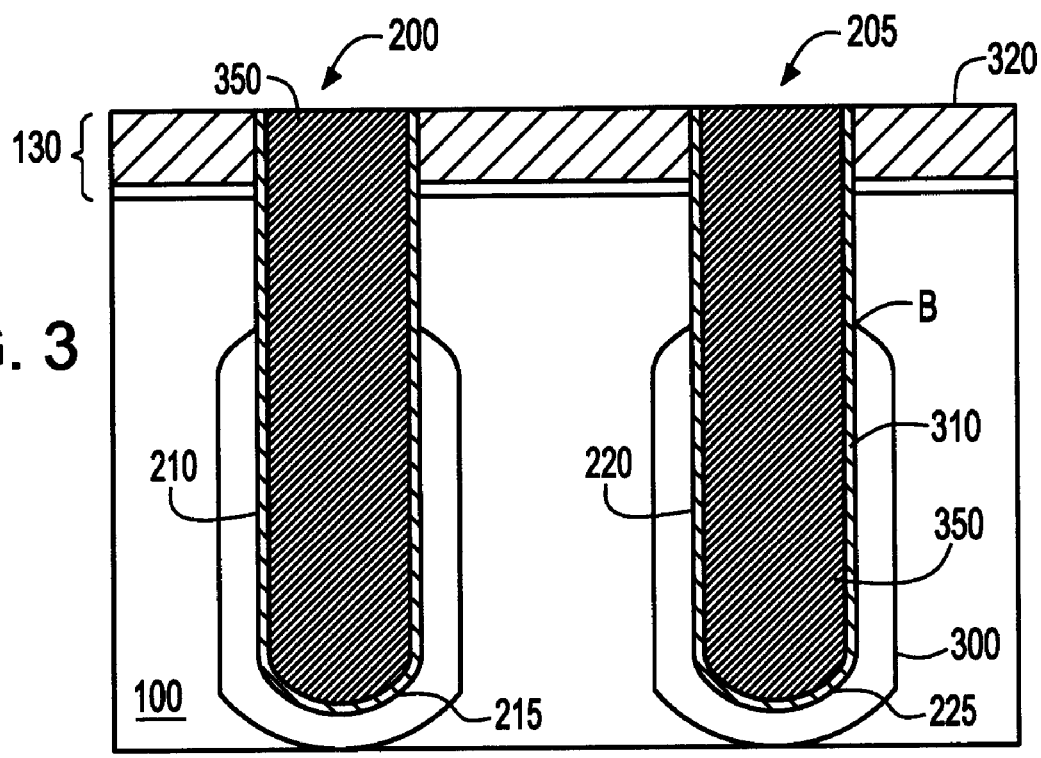

FIG. 3 shows a further stage of processing in which a buried plate 300 has been formed in a region of the semiconductor substrate 100 that surrounds the trenches 200, 205. The buried plate is typically a region of n-type counterdoped semiconductor material formed in a semiconductor substrate that is predominantly doped p-type. The buried plate is formed by any suitable process such as gas phase doping and dopant outdiffusion during a thermal drive-in process from a source of dopant material, e.g., a doped glass such as arsenic doped glass (ASG). For both trenches, the buried plate extends downwardly from a buried plate top depth B. After the buried plate 300 is formed, a node dielectric 310 is formed on the sidewalls 210, 220 and bottoms 215 and 225 of the trenches 200, 205, respectively. The node dielectric can be such as that traditionally used in DRAMs, e.g., silicon nitride, silicon oxide and/or silicon oxynitride or some combination thereof. Alternatively, a high dielectric constant node dielectric can be used. Thereafter, a material is deposited to fill the trenches 350 as a node electrode material. Preferably, the node electrode material 350 is a heavily doped n-type polysilicon. However, other conducting materials such as a metal or a conductive compound of a metal, e.g., a silicide, can be utilized under appropriate circumstances. In the particular embodiment shown in FIG. 3, the node electrode material consists essentially of heavily doped n-type polysilicon. As shown in FIG. 3, the deposited polysilicon 350 has also been planarized, such as by a process of chemical mechanical polishing (CMP), to a top surface of the pad stack 130.

Figure 4:
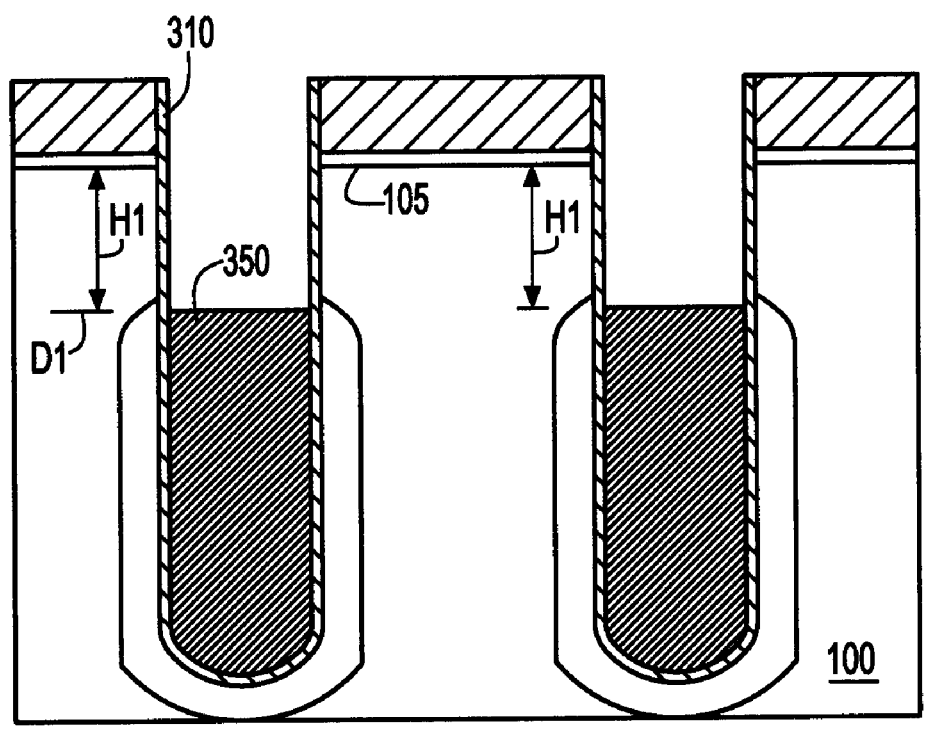

Thereafter, as shown in FIG. 4, the polysilicon 350 in the first and second trenches is recessed simultaneously to a first depth H1 from the major surface 105 of the semiconductor substrate 100. The recessing process is performed by any suitable process which etches the polysilicon 350 selectively to the material of the node dielectric 300.

Figure 5:
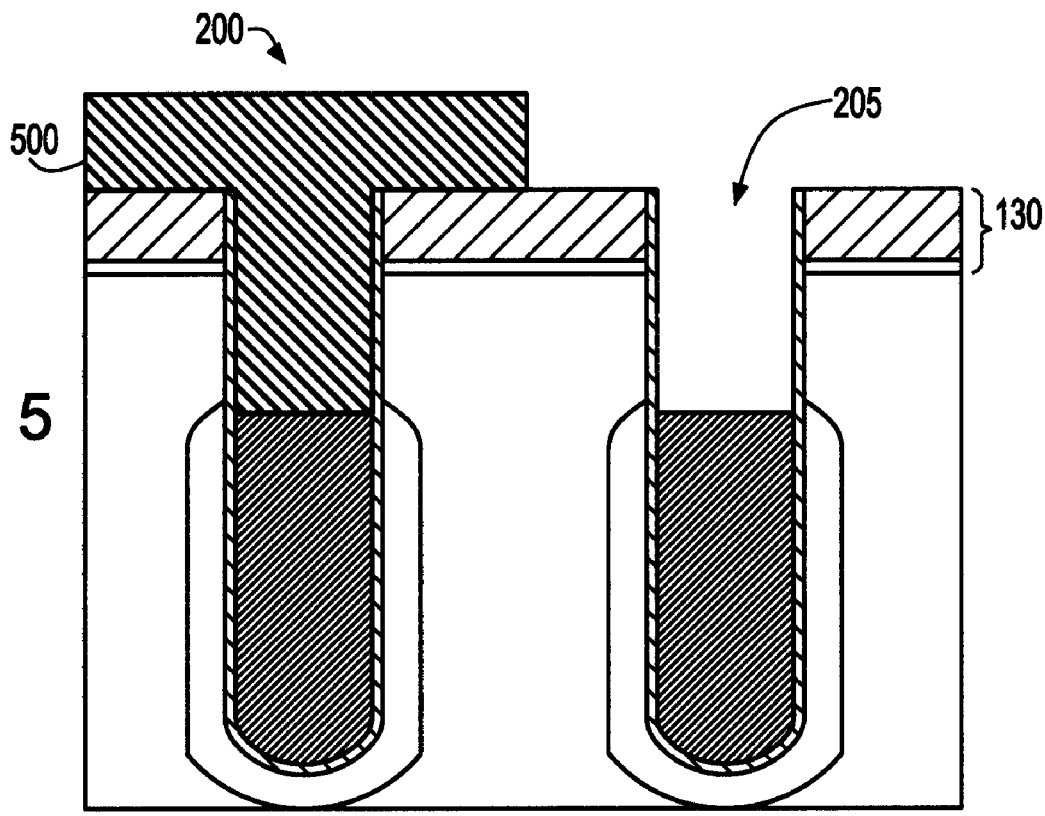

Thereafter, as shown in FIG. 5, the first trench 200 and areas of the pad stack 130 surrounding the trench 200 are masked, i.e., covered, by a mask layer 500. At this time, the second trench 205 is not masked by the mask layer 500. As discussed above, the first trench is representative of many such trenches which are typically disposed together in one or more locations of a chip. Accordingly, at this time, many trenches corresponding to the first trench are masked by the mask layer 500. Preferably, the mask layer 500 is formed by photolithographically patterning a photoresist layer.

Figure 6:
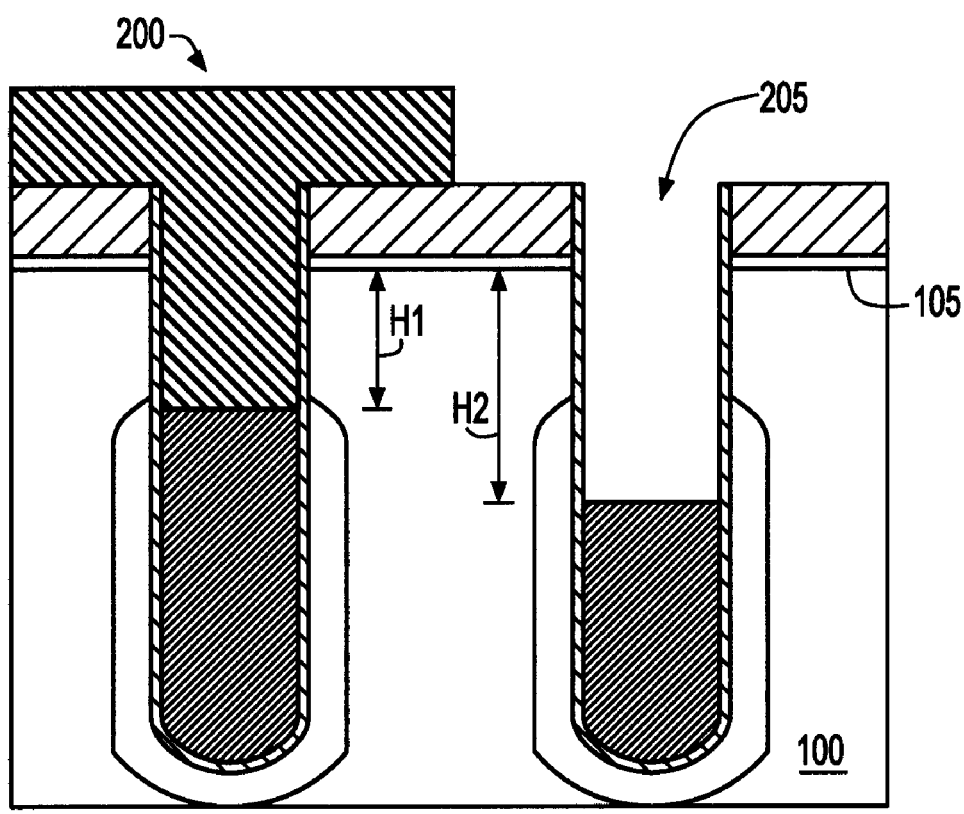

Thereafter, as shown in FIG. 6, while mask layer 500 remains in place, the polysilicon in the second trench 205 is recessed a second time to a second depth H2 from the major surface 105 of the semiconductor substrate 100 which is lower than the first depth H1. Stated another way, the second depth H2 is farther away from the major surface 105 of the semiconductor substrate 100 than is the first depth of recess H1 in the first trench 200.

Figure 7:
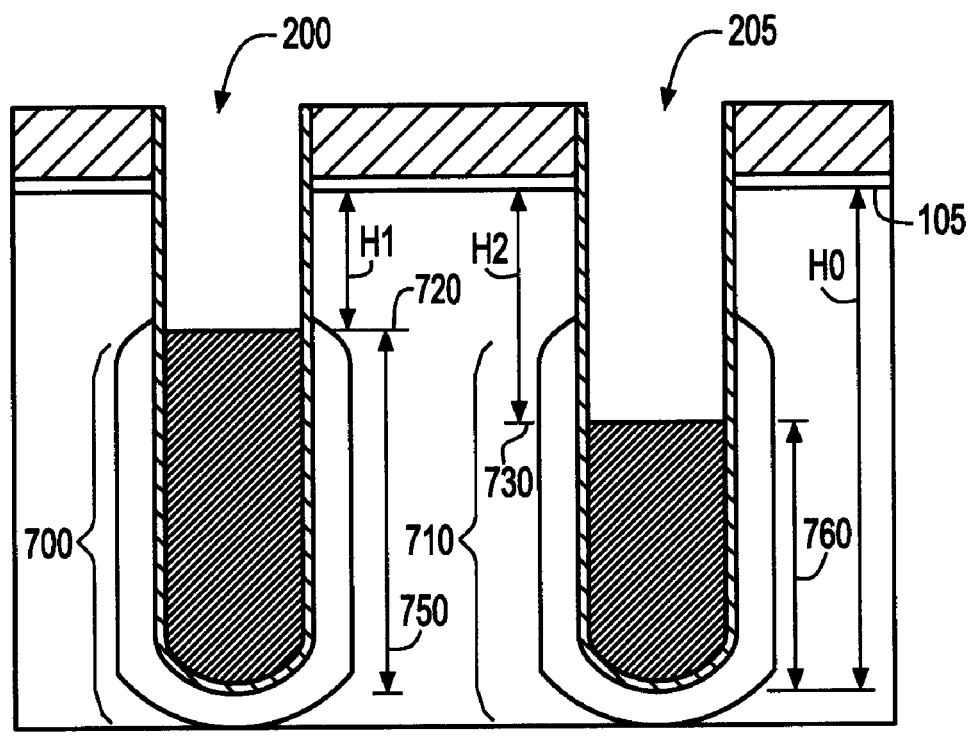

Thereafter, in a subsequent stage of processing shown in FIG. 7, the mask layer is removed from the first trench 200, as by a wet strip process, such as is well-known. The depths of recess of the polysilicon node electrode material 350 in both trenches 200, 205 is subject to being increased slightly as a result of the wet strip process, depending upon the selectivity of the process. Such increases in the depths of recess during post-recess processes are intended to be encompassed by the general terms H1 and H2, which are intended to be understood as relative terms, rather than as absolutes. At this point, trench capacitors 700 and 710 have been formed in respective first and second trenches 200, 205. The trench capacitors have top surfaces 720 and 730 that are disposed at different depths from the major surface 105. Specifically, trench capacitor 200 has a top surface 720 disposed at a depth H1 from the major surface 105, while trench capacitor 205 has a top surface 730 disposed at a depth H2 from the major surface 105. As a consequence of their different depths from the major surface 105, and that the trench capacitors 700, 710 are formed in trenches 200, 205 having the same bottom depth H0 and the same lateral dimensions 260, etc., (FIG. 2), the trench capacitors 700 and 710 have substantially different capacitance values. It is apparent that under such circumstances, the capacitance of each trench capacitor is proportional to its height, which is the same as H0–Hx. That is, for trench capacitor 700, the capacitance value is proportional to the height 750, while the capacitance value of trench capacitor 710 is proportional to the height 760. Therefore, the capacitance value of trench capacitor 700 is twice that of the trench capacitor 710 when the height 750 is twice that of the height 760.

Figure 8:
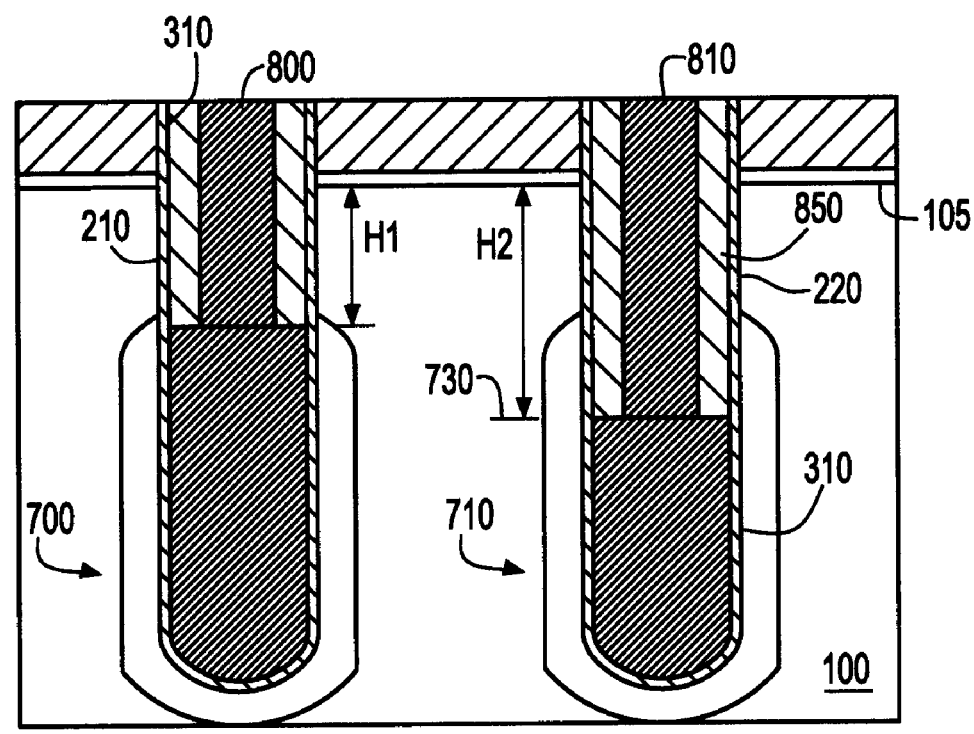

As shown in FIG. 8, further processing is performed to form conductors 800, 810 for interconnecting the trench capacitors 700, 710 to other elements (not shown) disposed at or above the major surface 105 of the substrate 100. The conductors 800, 810 preferably consist essentially of n+ doped polysilicon. The conductors 800, 810 are preferably formed after first forming a relatively thick dielectric collar 850 overlying sidewalls 210, 220 of each respective trench 200, 205. In one embodiment, the collar 850 is formed overlying the node dielectric 310 in each trench. Alternatively, the node dielectric 310 can be removed from the sidewalls 210, 220 of each trench prior to forming the collar 850. Typically, the collar 850 is formed by depositing an oxide such as silicon dioxide. Here, the material of the collar desirably has a low dielectric constant, especially when the trench capacitor 700 or 710 is used in a DRAM, in order to lessen parasitic capacitance between the material of the conductor 800 or 810 and the substrate 100 in this particular area.

Following the fabrication of the trench capacitors and conductors, further processing can be performed, if desired, to form transistors and/or other circuit elements that interconnect to ones of the trench capacitors. For example, in a storage cell array of a DRAM, at least one passgate transistor is connected to each trench capacitor of the storage cell array for controlling access to the trench capacitor, to store a data bit to the trench capacitor and to retrieve a stored data bit therefrom. Such passgate transistors can be planar devices, having a channel region which extends along the major surface of the substrate, or, alternatively, vertical transistors which have a channel region which extends in an essentially downward vertical direction along a sidewall of the trench. The processes for forming such passgate transistors are well-known and need not be discussed further.

Thus, an embodiment of the invention has been described in which trench capacitors having substantially different capacitance values have been formed by processing similar to that used to form trench capacitors of a DRAM array, without requiring trenches to be etched to different widths or different depths, and allowing photolithographic imaging and etching processes to be controlled according to traditional DRAM fabrication processes.

In another embodiment, the techniques of the present invention are applied to the fabrication of capacitors of another type of microelectronic element, a passive chip, such as an IPOC. An IPOC typically supports the function of an active chip, e.g., one having switching, amplification and/or rectification functions. An IPOC typically includes capacitors, inductors and/or resistors. IPOCs that are mounted to the contact pads of an active integrated circuit chip, e.g, via a ball grid array, are typically fabricated on ceramic, glass or semiconductor substrates having a CTE the same as or close to that of active chip. Differences in processing of such passive chip or IPOC will now be pointed out. As capacitors of the IPOC generally require higher values than those on an active chip per se, the lateral dimensions for photolithographically imaging and etching the trenches can be greatly relaxed. Thus, such capacitors on an IPOC can be patterned to lateral dimensions that are larger by one or more orders of magnitude than the lateral dimensions of trench capacitors on an active chip. In processing trench capacitors on an IPOC having a semiconductor substrate, the buried plate 300 is eliminated in one embodiment, such that the path to ground is provided through the substrate from the area adjacent to the node dielectric 310. Alternatively, in another embodiment, the outer plate of the trench capacitor is provided by a conductive material deposited on the sidewalls of the trenches 210, 220 prior to formation of the node dielectric.

In one embodiment, the lower capacitance value trench capacitors 710 are utilized as trench capacitors of a DRAM array. The trench capacitors of a DRAM array cannot have capacitance values which are too high because that would slow down their operation, causing the time for accessing each storage cell to be excessive.

Figure 9:
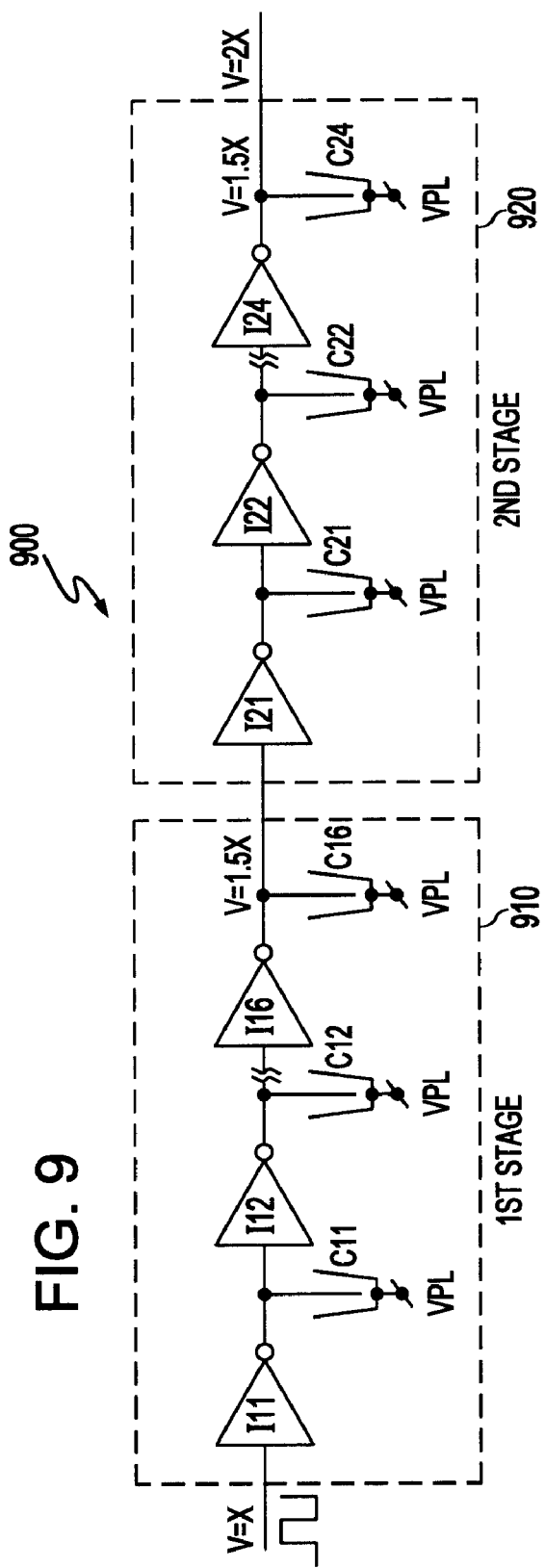
FIG. 9 is a diagram illustrating an internal power supply generator circuit according to an embodiment of the invention.

The higher capacitance value trench capacitors 700 are utilized for other purposes, e.g., for applications in which a large amount of capacitance is needed for functions provided on the chip. In one embodiment, as shown in FIG. 9, the larger value trench capacitors are used in an internal power supply generator circuit 900. Such circuit 900 operates as a charge pump to boost an input supply voltage at one value X to an output power supply voltage having a value 2.0 X, i.e., twice the input voltage level. The circuit 900 has two stages 910 and 920. The first stage produces an output supply voltage at 1.5 X, i.e., 1.5 times the input voltage level. The second stage boosts that voltage supply from 1.5X to 2.0 X, i.e., twice the input voltage level.

Each of the first and second stages 910, 920 of the circuit include multiple chains of inverters and multiple capacitor networks. For example, the first pump stage 910 includes inverter chains I11, I12 and . . . I16, each having a capacitor network, i.e., networks C11, C12 and . . . C16. In one embodiment, capacitor networks of the first stage have values of 100 pF each. The second pump stage 920 includes inverter chains I21, I22 and . . . I24, each having a capacitor network, i.e., networks C21, C22 and . . . C24. In such embodiment, capacitor networks of the second stage have values of 35 pF each. The large capacitance values of such capacitor networks require that a great number of trench capacitors be used. Such large numbers of trench capacitors take up undesirably large amounts of the area of a chip or macro of which a DRAM is a part. For example, the power supply generator circuit 900 may be provided to support an embedded DRAM macro of a multi-function chip such as an SOC. In this example, a trench capacitor of a DRAM macro has a value of 40 fF for the current generation. If the 100 pF capacitor networks C11 C16 of the first stage 910 are implemented by the same value (40 fF) trench capacitors as those used in the DRAM array of the macro, then 15,000 such trench capacitors are needed for each such capacitor network. In the second stage, when the 35 pF capacitor networks C21 C24 are implemented by the same value (40 fF) trench capacitors, 3500 such trench capacitors are needed for each capacitor network. An estimate of the area required to implement all of such capacitor networks in both the first and second stages is 120 μx 700 μm. In 0.12 μm technology, such area is approximately 10% of the area of a 4 MB embedded DRAM macro.

According to an embodiment of the invention, the higher capacitance value trench capacitors described herein are advantageously used in place of the trench capacitors that are typically used as storage capacitors of a DRAM. Thus, when the higher capacitance value trench capacitors have a value of 80 fF, which is double the capacitance value of the trench capacitors (40 fF) provided as DRAM storage capacitors, the area occupied by each capacitor network C11, C12, etc., and C21, C22, etc., is halved. Ultimately, the reduction in the size of each capacitor network reduces the size of the DRAM macro by 5%.

Figure 10:
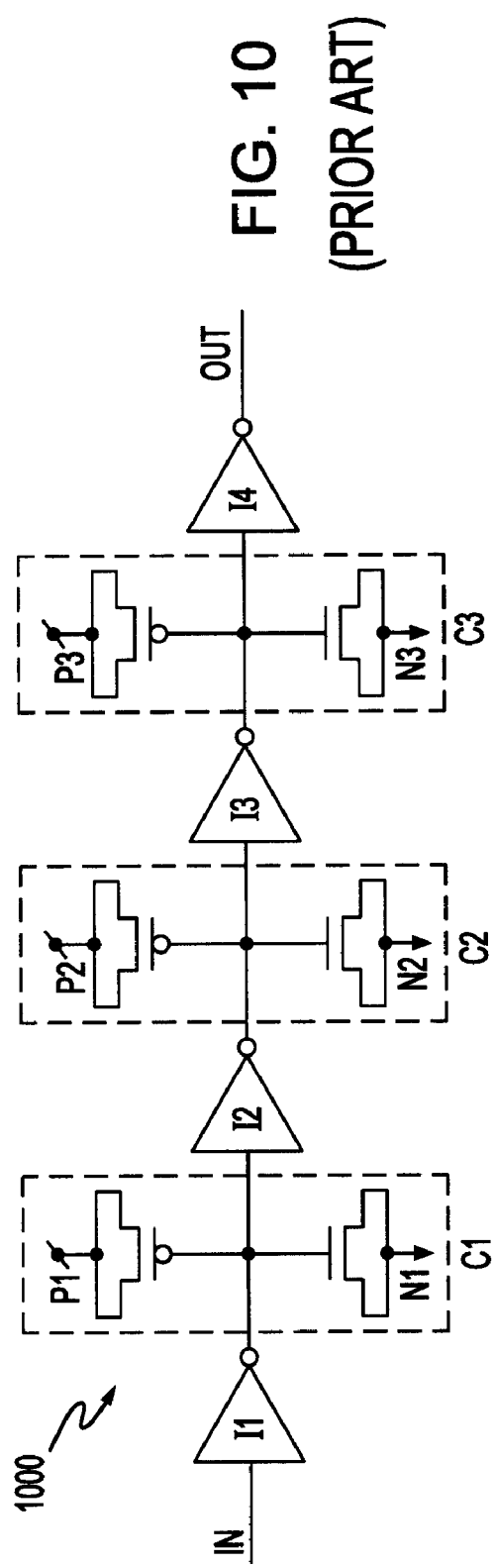
FIG. 10 is a diagram illustrating a delay circuit according to the prior art.

FIG. 10 illustrates another application in which capacitors are utilized in an internal circuit 1000 of a chip having an input and output to other circuits of the chip. The circuit shown in FIG. 10 and the types of capacitors utilized therein are prior art. Specifically, the internal circuit is a delay chain circuit, which includes multiple chains of inverters I1, I2, I3, and I4 and multiple transistor-capacitor networks C1, C2 and C3. The transistor-capacitor networks are connected to respective outputs of the inverter chains I1, I2 and I3. As provided by the prior art, a transistor-capacitor network includes an n-type field effect transistor (NFET), having its gate terminal connected to the output of one of the inverter chains, e.g., I1, and its drain and source terminals connected to ground. The transistor-capacitor network further includes a p-type field effect transistor (PFET), having its gate terminal connected to the output of one of the inverter chains, e.g., I1, and its drain and source terminals connected to a power supply voltage Vdd, or other voltage representative of logic level "1". Being connected in this manner, the transistors of each network C2, C2 and C3, operate as capacitors.

One problem with the circuit 1000 shown in FIG. 10 is the large amount of area of the chip that is used to provide the transistor-capacitor networks. Typically, the transistors have a non-minimum channel length, e.g. L=1 μm for 0.12 μm technology, and non-minimum channel width, e.g. 1 to 10 μm for 0.12 μm technology. When the circuit 1000 implements a 1 ns delay, the size of PFET capacitors are each L=1 μm and W=5 μm and the size of the size of NFET capacitors are each L=1 μm and W=2.5 μm. An estimate of the area occupied by such circuit 1000 to implement a 1 ns delay is 80 μm.

Figure 11:
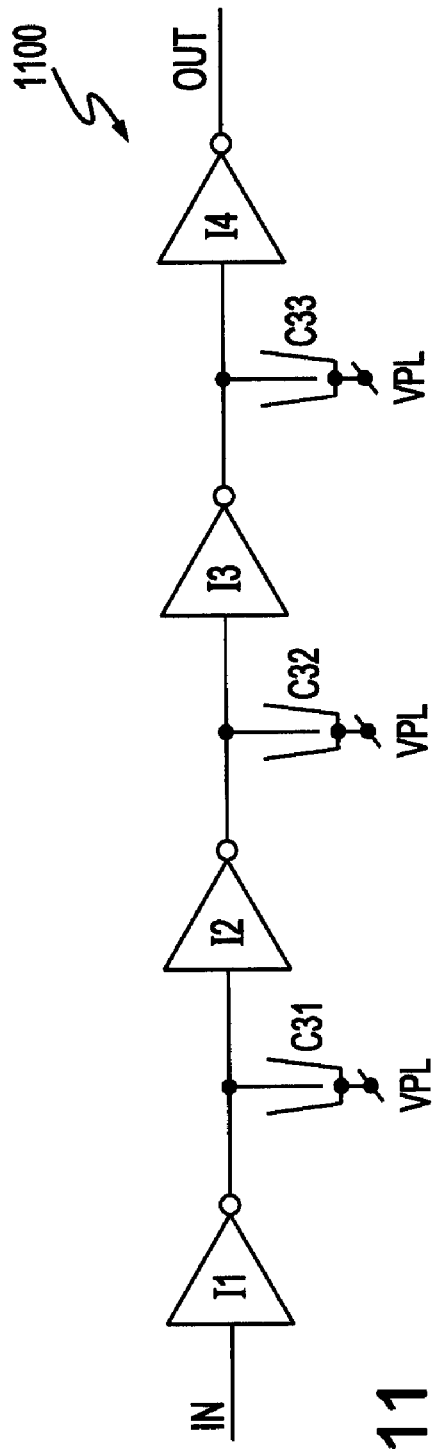
FIG. 11 is a diagram illustrating a delay circuit according to an embodiment of the invention.

FIG. 11 illustrates another embodiment of the invention in which larger capacitance value trench capacitors are used in capacitor networks of a delay circuit 1100, instead of transistor-capacitor networks as illustrated in FIG. 10. In such arrangement, a large number of higher value (e.g., 80 fF) trench capacitors are wired together to operate as a capacitor network C31, C32, or C33. By such arrangement a sizable reduction in the area occupied by the delay circuit 1100 is achieved. An estimate of the area occupied by the delay circuit 1100 is 32 μm², a reduction of 60%. Since several delay chains are typically provided within a DRAM macro of an integrated circuit, a large cumulative area reduction is achieved.

Figure 12:
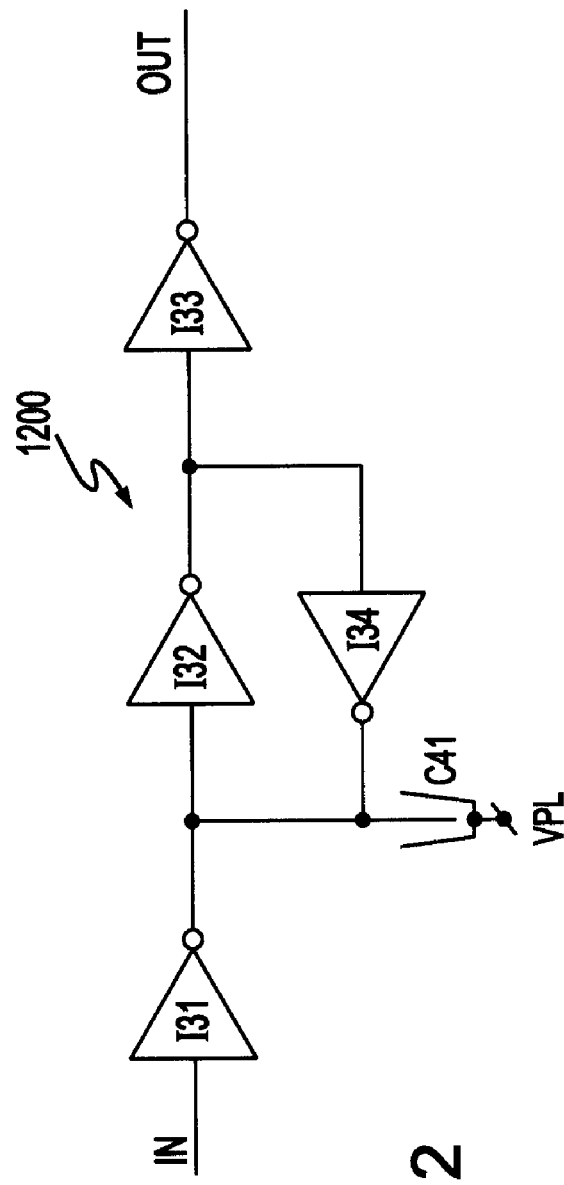
FIG. 12 is a diagram illustrating a feedback stabilized latch according to an embodiment of the invention.

FIG. 12 illustrates another embodiment of the invention in which a feedback stabilized latch 1200 is provided. In this embodiment, a capacitor C41 is provided as an element of a feedback loop to a latch to help prevent the latch from toggling between states. In this embodiment, the capacitor C41 can either have a smaller capacitance value, the same capacitance value, or a larger capacitance value than capacitors used to implement storage capacitors of a DRAM array. In such manner, a greater degree of granularity can be achieved for designing in an appropriate capacitance value for the circuit 1200. Moreover, the capacitor C41 is used in place of a transistor-capacitor network such as that described above relative to FIG. 10, which is conventionally provided in similar latch circuits, leading to a reduction in area which is estimated to be 56%. Since such feedback stabilized latch circuits are used in many places of a DRAM macro, a significant reduction in area is possible.

While the invention has been described in accordance with certain preferred embodiments thereof, those skilled in the art will understand the many modifications and enhancements which can be made thereto without departing from the true scope and spirit of the invention, which is limited only by the claims appended below. For example, trench capacitors having three or more values of capacitance can be formed according to an embodiment of the invention by conducting further masked recesses of the polysilicon material within one or more of the trenches. In other embodiments, trench capacitors having different values are utilized for such purposes as DC-blocking, impedance matching, filtering, oscillator circuitry, and so on.

The invention claimed is:

1. A microelectronic element, comprising:
    a first trench disposed within a substrate;
    a second trench disposed within the substrate,
    each of the first and second trenches having a sidewall extending along a region of single-crystal semiconductor material in the substrate, and each of the first and second trenches being elongated in a direction extending downwardly from a major surface of the substrate;
    a first dielectric collar extending downwardly along the sidewall of the first trench to a first depth below the major surface of the substrate, the first dielectric collar for reducing parasitic capacitance along an upper portion of the first trench;
    a first capacitor extending from the first dielectric collar at the first depth downwardly along the single-crystal semiconductor region along the sidewall of the first trench;
    a second dielectric collar extending downwardly along the sidewall of the second trench to a second depth deeper below the major surface of the substrate than the first depth, the second dielectric collar for reducing parasitic capacitance along an upper portion of the second trench;
    a second capacitor extending from the second dielectric collar at the second depth downwardly along the single-crystal semiconductor region along the sidewall of the second trench,
    such that a top of the first capacitor is disposed at the first depth from the major surface, and a top of the second capacitor is disposed at the second depth from the major surface.

2. The microelectronic element as claimed in claim 1, wherein bottoms of the first and second capacitors are disposed at substantially the same depth from the major surface.

3. The microelectronic element as claimed in claim 2, wherein the first and second capacitors have substantially different capacitances.

4. The microelectronic element as claimed in claim 3, wherein the first and second trenches have substantially the same lateral dimensions in lateral directions of a first plane substantially parallel to the major surface.

5. The microelectronic element as claimed in claim 4, wherein the microelectronic element includes passive devices, the passive devices selected from the group consisting of resistors, inductors and the first and second capacitors, and the microelectronic element does not include active devices, such active devices having functions of at least one of amplification, switching and rectification.

6. A microelectronic element as claimed in claim 3, further comprising a plurality of first circuits each including one or more of active devices, the active devices having functions of at least one of amplification, switching and rectification, and a plurality of second circuits each including one or more of the active devices, the first circuits further including one or more of the first capacitors and the second circuits further including one or more of the second capacitors.

7. A microelectronic element as claimed in claim 6, wherein the first circuits include storage cells of a dynamic random access memory (DRAM) array.

8. A microelectronic element as claimed in claim 7, wherein the second circuits include circuits that support the DRAM array.

9. A microelectronic element as claimed in claim 6, wherein the first circuits include charge-pumping circuits each having a multiplicity of first capacitors, wherein the first capacitors have substantially higher capacitances than the second capacitors.

10. A microelectronic element as claimed in claim 6, wherein the first circuits include inverter delay chain circuits having a multiplicity of the first capacitors.

11. A microelectronic element as claimed in claim 6, wherein the first circuits include first feedback latches each including one or more of the first capacitors and second feedback latches each including one or more of the second capacitors.

12. A microelectronic element as claimed in claim 6, wherein at least one of the second circuits includes an array of the second capacitors having a common connection to a non-ground potential, wherein the array has at least one function selected from the group consisting of signal transfer and power supply decoupling.

13. The microelectronic element as claimed in claim 1, further comprising an array of the second capacitors, each of the second capacitors having a common connection to a non-ground potential, the array of the second capacitors functioning to provide at least one of signal transfer decoupling or power supply decoupling.

* * * * *